(12) United States Patent
Herrera E.

(10) Patent No.: US 7,012,644 B1
(45) Date of Patent: Mar. 14, 2006

(54) MULTIPLE OUTPUT NODE CHARGE COUPLED DEVICE

(75) Inventor: Oscar R Herrera E., Greeley, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 917 days.

(21) Appl. No.: 09/656,288

(22) Filed: Sep. 6, 2000

(51) Int. Cl.
*H04N 5/335* (2006.01)
*H04N 3/14* (2006.01)

(52) U.S. Cl. .................. 348/294; 348/311; 348/283

(58) Field of Classification Search ........... 348/294, 348/302, 311, 300, 281, 322, 321, 320, 241, 348/283
See application file for complete search history.

(56) References Cited

U.S. PATENT DOCUMENTS

| | | | | |
|---|---|---|---|---|
| 4,709,259 A | * | 11/1987 | Suzuki | 348/280 |
| 4,819,070 A | * | 4/1989 | Hynecek | 348/302 |
| 4,827,345 A | * | 5/1989 | Nakagawa et al. | 358/482 |
| 4,831,451 A | * | 5/1989 | Hynecek | 348/281 |
| 4,985,758 A | * | 1/1991 | Hashimoto | 348/283 |
| 4,989,075 A | * | 1/1991 | Ito | 348/280 |
| 5,063,439 A | * | 11/1991 | Tabei | 348/272 |
| 5,262,870 A | * | 11/1993 | Nakamura et al. | 348/300 |
| 5,335,008 A | * | 8/1994 | Hamasaki | 348/301 |
| 5,585,652 A | * | 12/1996 | Kamasz et al. | 257/231 |
| 5,745,193 A | * | 4/1998 | Urbanus et al. | 348/771 |
| 5,841,126 A | * | 11/1998 | Fossum et al. | 250/208.1 |
| 5,883,667 A | * | 3/1999 | Taniji | 348/248 |
| 5,956,086 A | * | 9/1999 | Sawanobori | 348/273 |
| 5,990,952 A | * | 11/1999 | Hamasaki | 348/311 |
| 6,211,914 B1 | * | 4/2001 | Kubo | 348/241 |
| 6,215,113 B1 | * | 4/2001 | Chen et al. | 250/208.1 |
| 6,303,923 B1 | * | 10/2001 | Wadsworth et al. | 250/214 LA |
| 6,476,864 B1 | * | 11/2002 | Borg et al. | 348/245 |
| 6,529,237 B1 | * | 3/2003 | Tsay et al. | 348/241 |
| 6,650,369 B1 | * | 11/2003 | Koizumi et al. | 348/301 |

* cited by examiner

*Primary Examiner*—Aung Moe

(57) ABSTRACT

A system for optically imaging includes an array of cells, a charge shift register, two or more charge sensing nodes, and a charge demultiplexor. Each cell produces an electrical charge in response to photon stimulation. The charge shift register receives the electrical charge produced by each cell and sequentially outputs the electrical charge to the charge demultiplexor. The charge demultiplexor selectively distributes the charge from each cell to one of the charge sensing nodes. The charge sensing nodes accumulate the charge until reset by a controller.

15 Claims, 3 Drawing Sheets

MULTIPLE OUTPUT NODE CHARGE COUPLED DEVICE

FIELD OF THE INVENTION

This invention relates in general to optical imaging and, more particularly, to a charge coupled device having multiple output nodes.

BACKGROUND OF THE INVENTION

In the field of optical imaging, there are many types and configurations of charge coupled device (CCD) arrays. CCD arrays are composed of many light, or photon, sensing cells. Photons striking these cells cause the cells to produce an electrical charge. The charge from these cells is sequentially communicated to an analog shift register, often called a horizontal shift register or a CCD shift register.

The CCD shift register receives the charge from each cell sequentially, the image usually being read out from the left to right then top to bottom. The charge from each of the cells is stored in a register position and then output sequentially from the register to a CCD output node.

The CCD output node holds the charge, creating a voltage differential. The voltage differential is viewed at intervals and communicated to an analog to digital converter, usually through some combination of buffers and amplifiers. The analog to digital converter digitizes the voltage to produce pixels that form an image.

One variation to this configuration is to include more than one output CCD shift register. The output CCD shift registers may be physically contiguous, or not. The multiple physically contiguous output CCD shift registers function as multiple output CCD shift registers, not a single output CCD shift register. The output CCD shift registers output charges to a like number of CCD output nodes, each output CCD shift register outputting its charge to only one CCD output node.

SUMMARY OF THE INVENTION

According to principles of the present invention, a system for optically imaging includes an array of light sensitive cells that convert light intensity to charge proportionally, an output CCD register, two or more charge sensing nodes, and a charge demultiplexor.

According to further principles of the present invention, each cell produces an electrical charge in response to photon stimulation. The charge shift register receives the electrical charge produced by each cell and sequentially outputs the electrical charge to the charge demultiplexor. The charge demultiplexor selectively distributes the charge from each cell to one of the charge sensing nodes. The charge sensing nodes accumulate the charge until reset by a controller.

DETAILED DESCRIPTION OF THE INVENTION

Figure 1:
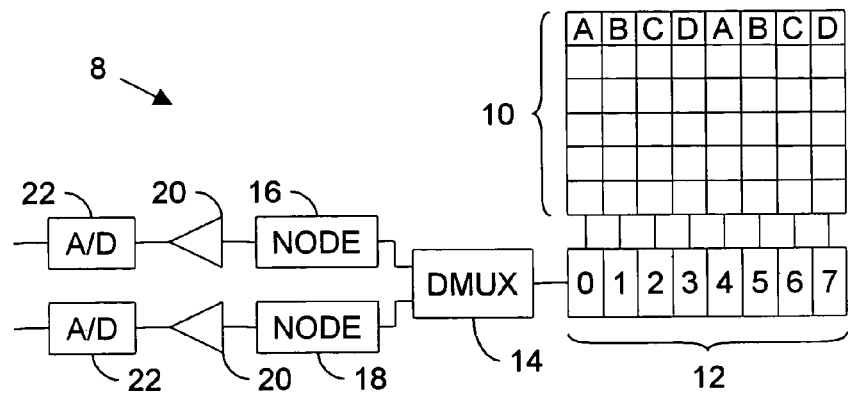
FIG. 1 is a block diagram representing one embodiment of the present invention system multiple node charge coupled device.

Illustrated in FIG. 1 is a system 8 for optically imaging. System 8 includes an array 10 of cells, a charge shift register 12, a charge demultiplexor 14, a first charge sensing node 16, a second charge sensing node 18, output buffers 20, and analog to digital converters 22. A control system (not shown) is also required for the present invention. Control systems are well known in the art. The specific details of the control system are not important to the present invention. It is only important that the control system is able to control elements of the present invention where necessary to ensure cooperation between the elements.

A common example of array 10 is a charge coupled device (CCD) array. Each cell in the array of cells 10 is a light, or photon, sensing cell. The cells each produce an electrical charge in response to a photon stimulus. The more photons striking the cells, the more negative the charge produced by the cells. The electrical charge produced by each cell may be referred to as a cell electrical charge to indicate the origin of the charge and that the charge from each cell is, in most cases, isolated from the charge from the other cells.

In the figure, some of the cells are labeled with the letters A through D. These reference letters will be used to describe embodiments of the process of the present invention. Additionally, array 10 is depicted as having eight columns and six rows. The number of rows and columns was chosen for clarity and ease of reference. Array 10 may actually have any number of rows and columns and typically will have at least 800 columns and 600 rows.

Charge shift register 12 is often referred to as an output CCD shift register or a horizontal shift register. Charge shift register 12 includes charge containers 0–7. Each charge container 0–7 is able to hold one cell charge at a time. In one embodiment, charge shift register 12 receives cell charges from an entire row of cells, for example ABCDABCD. The cell charges are then shifted to one side or the other within charge shift register 12 with the end cell charge being output from charge shift register 12.

Charge shift register 12 is depicted as having eight charge containers. The number of charge containers was chosen for clarity and ease of reference. Charge shift register 12 may actually have any number of charge containers and typically will have at least 800 columns and will typically exceed the number of columns of array 10. There may also be additional charge containers between container 0 and demultiplexor 14.

Charge demultiplexor 14 is any device for receiving input from charge shift register 12 and selectively outputting to charge sensing nodes 16, 18.

Charge sensing nodes 16, 18 are often referred to as CCD nodes or output nodes. Charge sensing nodes 16, 18 are any device capable of receiving a charge from charge demultiplexor 14 and holding the charge so that the charge may be read as a voltage. For example, charge sensing nodes 16, 18 may be capacitors, or reverse biased diodes.

Only two charge sensing nodes 16, 18 are shown in FIG. 1. The number of charge sensing nodes 16, 18 was chosen for clarity and ease of reference. Any number of charge sensing nodes 16, 18 greater than one may be used for the present invention.

Output buffers 20 are any device or combination of devices for isolating charge sensing nodes 16, 18 from analog to digital converters 22. Output buffers 20 may also include amplifiers.

Analog to digital converters 22 are any devices or combinations of devices for digitizing electrical voltage signals. These devices may contain circuitry to pre-condition the electrical signal before the digitizing process. This circuitry may include a correlated-double-sampler and gain stages.

Figure 2:
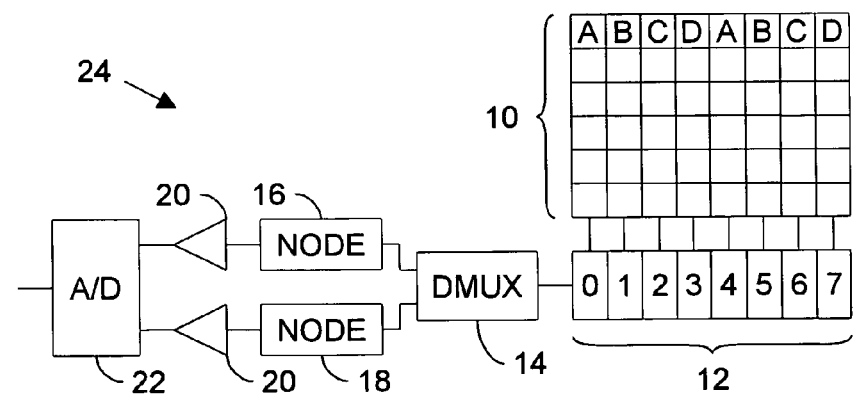
FIG. 2 is a block diagram representing an alternate embodiment of the present invention system multiple node charge coupled device.

Illustrated in FIG. 2 is an alternate embodiment system 24 for optically imaging. Elements that are the same as those illustrated in FIG. 1 are labeled with the same reference numbers. System 24 differs from system 8 only in that all of the output buffers 20 share the same analog to digital converter 22. A timing scheme that accounts for the shared analog to digital converter 22 must be used.

Figure 3:
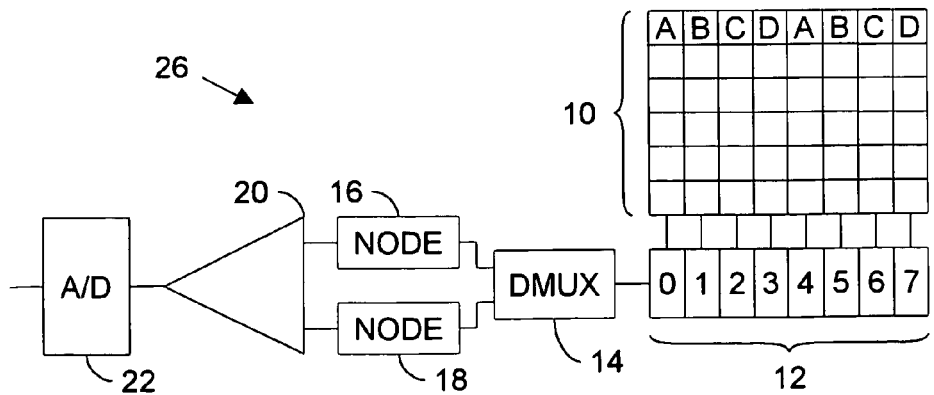
FIG. 3 is a block diagram representing another alternate embodiment of the present invention system multiple node charge coupled device.

Illustrated in FIG. 3 is another alternate embodiment system 26 for optically imaging. Elements that are the same as those illustrated in FIGS. 1 and 2 are labeled with the same reference numbers. System 26 differs from system 24 only in that all of the charge sensing nodes 16, 18 share the same output buffer 20. A timing scheme that accounts for the shared output buffer 20 must be used.

Figure 4:
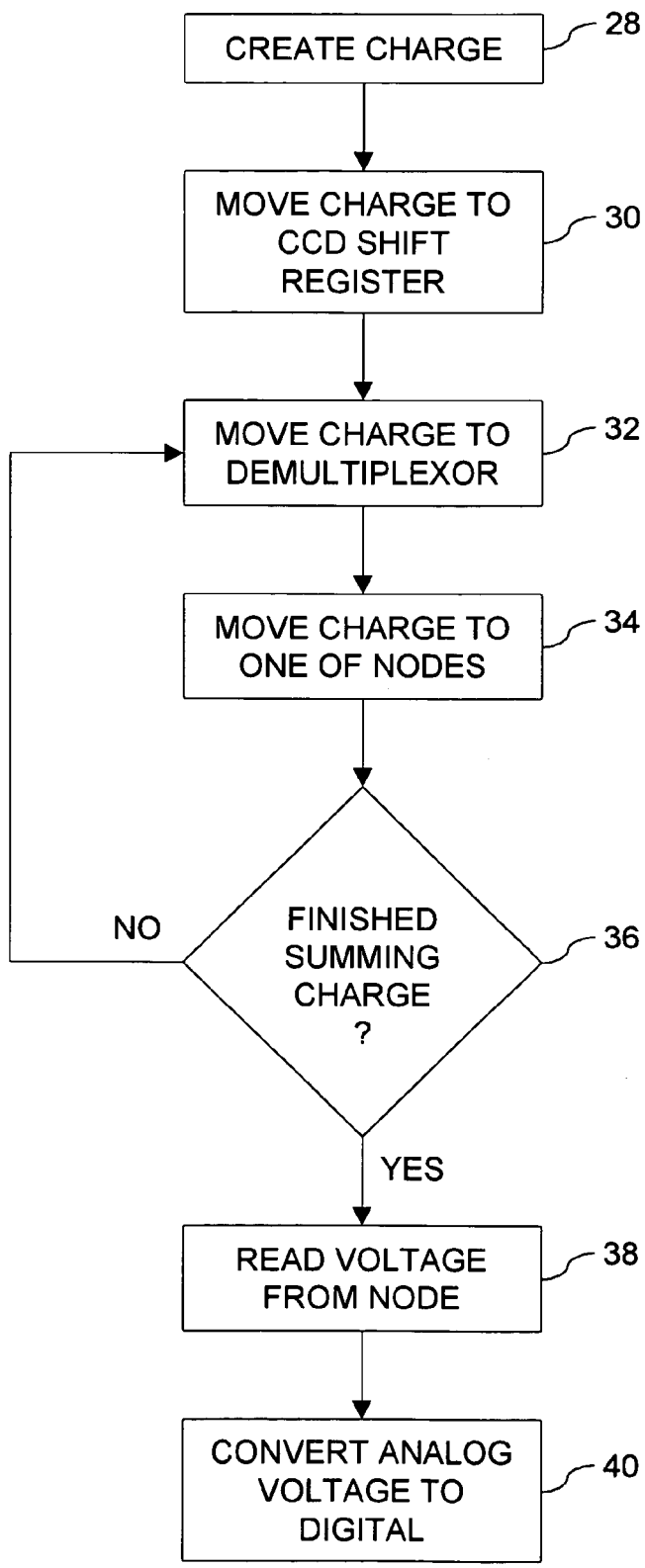
FIG. 4 is a flow chart illustrating one embodiment of a method for practicing the present invention method for producing a voltage signal segmented to represent an output of an array of cells that produce a cell electrical charge in response to photon stimulation.

FIG. 4 is a flow chart illustrating one embodiment of a method of the present invention. Array 10 is exposed to a light source such as an image. Photons from the light source strike the cells of array 10 and generate 28 cell charges. For example, cells ABCDABCD each generate 28 a cell charge. The cell charge for each cell is independent of the cell charge for other cells in array 10. Together, the cell charges for each cell in array 10 represent the light source or image.

The cell charges are sequentially moved 30 from array 10 to charge shift register 12. In one embodiment, a whole row of charges is moved into charge shift register 12. For example, cell charges for cells ABCDABCD are moved into charge containers 0–7, respectively.

Each cell charge is sequentially read 32 out of charge shift register 12 and into demultiplexor 14. For example, cell charge A is first read out of shift register 12, then charge B, then charge C, and so on until each of the charges ABCDABCD has been read 32 out of charge shift register 12 and into demultiplexor 14. Charges from the next row of cells are then moved 30 into charge shift register 12 either after charge shift register 12 has been emptied or while charges remain in shift register 12.

As each charge is read out of shift register 12, the remaining cell charges each shift one charge towards output of shift register 12. For example, as charge A is read out of container 0, charge B is shifted from container 1 into container 0, charge C is shifted from container 2 into container 1, and so on.

Demultiplexor 14 selectively provides 34 the charges to one of the charge sensing nodes 16, 18. In one embodiment, demultiplexor 14 alternates between first charge sensing node 16 and second charge sensing node 18, providing one cell charge at a time to each node. For example, demultiplexor 14 may provide charge A to first charge sensing node 16, charge B to second charge sensing node 18, charge C to first charge sending node 16, and charge D to second charge sensing node 18.

In alternate embodiments, demultiplexor 14 provides 34 the charges to charge sensing nodes 16, 18 as necessary to achieve the desired outcome. For example, demultiplexor 14 may provide 34 charges A, B, and C to first charge sensing node 16 and charge D to second charge sensing node 18. This pattern is useful if three out of every four charges is to be discarded and the fourth charge retained.

In one embodiment, charges are summed 36 before reading 38 the voltage from charge sensing nodes 16, 18. For example, charges A and C are summed 36 in first charge sensing node 16 and charges B and D are summed 36 in second charge sensing node 18. Any number of charges may be summed 36 before reading 38 them from charge sensing nodes 16, 18. However, care must be taken not to exceed the charge capacity of the charge sensing nodes 16, 18.

Once the desired number of charges has been summed 36 in charge sensing nodes 16, 18, the voltage is read from charge sensing nodes 16, 18. The voltage may be read simultaneously or consecutively from charge sensing nodes 16, 18. The voltage signal produced by reading the voltages passes through any desired buffers and amplifiers to reach analog to digital converters 22, where the voltage signal is digitized 40.

One advantage to the system of the present invention is that in embodiments with two output nodes 16, 18 and two separate analog to digital converters 22, the bandwidth requirement is halved compared to conventional configurations with only one output node. The amount, or energy, of random broadcast noise added to a signal being digitized depends on the square root of the bandwidth of the digitizing system. It is therefore an advantage to reduce, as much as possible, the bandwidth of the digitizing system in order to improve the signal to noise ratio. Charge binning additionally increases the signal to noise ratio by adding more than one charge packet, or cell charge, before the digitizing process.

Figure 5:
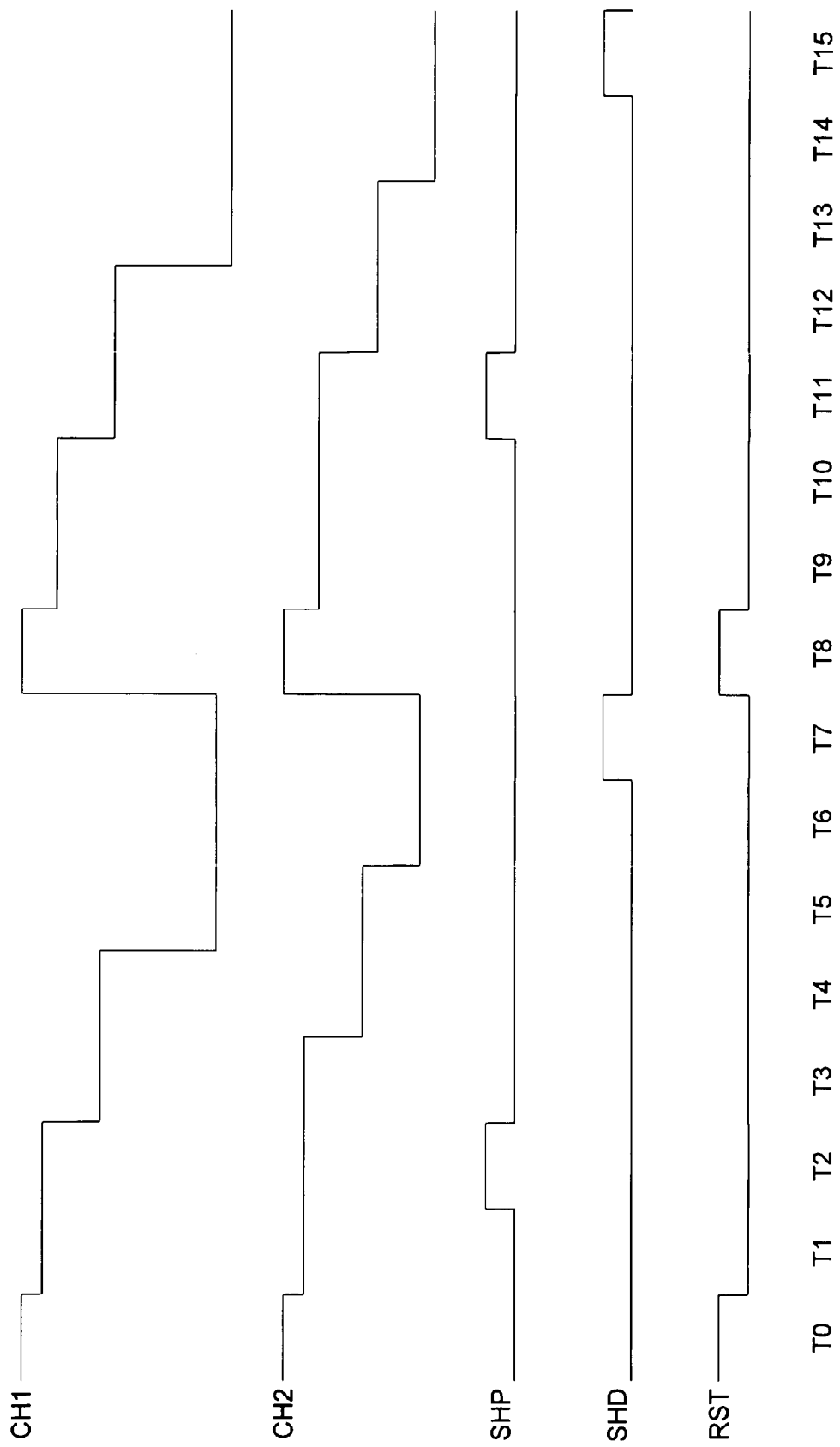
FIG. 5 is an illustrative timing diagram for use with the system and method of the present invention as shown in FIGS. 1, 2, 3, and 4.

Illustrated in FIG. 5 is a sample timing diagram for summing charges. Signal CH1 is the voltage represented by the charge in first charge sensing node 16. Signal CH2 is the voltage represented by the charge in second charge sensing node 18. SHP is sample preset signal. SHD is a sample data signal. RST is a reset signal.

In operation, charge sensing nodes 16, 18 are typically reset to a preset voltage. However, the preset voltage is not always consistent. Therefore, the preset voltage signal is sampled before charge is moved to the charge sensing nodes 16, 18. After charge is moved into charge sensing nodes 16, 18, the voltage signal, now representing the data or video level, is sampled again. The difference between the preset voltage signal and the data voltage signal is an accurate reflection of the charge moved to charge sensing devices 16, 18.

With reference to FIG. 5, at time T0, a reset signal is present. The reset signal pulses CH1 and CH2 to a high level, which cleans charge from charge sensing nodes 16 and 18. At time T1, the reset signal is released and CH1 and CH2 both return to preset levels. At time T2, the preset signal is sampled for both CH1 and CH2.

At time T3, cell charge A (from previous examples) is put into first charge sensing node 16. Cell charge A lowers the voltage on CH1. At time T4, cell charge B is put into second node 18. Cell charge B lowers the voltage on CH2. At time T5, CH1 is lowered by charge C, thus summing cell charges A and C. At time T6, CH2 is lowered by charge D, thus summing cell charges B and D.

Summing charges is a desirable way of increasing the signal to noise ratio in optical imaging. The drawback of summing charges is the resolution of the resulting image will be reduced. If two charges are summed for each read, the resolution of the image will be halved.

At time T7, the data signal is sampled for both CH1 and CH2. A difference is obtained between the preset voltage and the data voltage. The difference is the voltage signal passed to analog to digital converters 22.

At time T8, both CH1 and CH2 are reset. The pattern continues with the next four cell charges ABCD and so on until all of the cells have been read.

The foregoing description is only illustrative of the invention. Various alternatives and modifications can be devised by those skilled in the art without departing from the invention. Accordingly, the present invention embraces all such alternatives, modifications, and variances that fall within the scope of the appended claims.

What is claimed is:

1. A system for optically imaging, the system comprising:
   (a) an array of cells for producing an electrical charge in response to photon stimulation;
   (b) a charge shift register having a plurality of charge containers for storing charge, the charge shift register configured to receive the electrical charge produced by each cell in the array and to sequentially shift the charges between the charge containers and output the electrical charge of each cell;
   (c) at least two charge sensing nodes for accumulating charge readable, from each charge sensing node, as a voltage; and,
   (d) a charge demultiplexor configured to receive the output charge of the charge shift register and to selectively distribute the output charge to each of the at least two charge sensing nodes.

2. The system of claim 1 wherein the array of cells includes a charge coupled device array.

3. The system of claim 1 further including at least one output buffer configured to receive the voltage of each of the at least two charge sensing nodes.

4. The system of claim 1 further including at least one amplifier configured to amplify the voltage from the at least two charge sensing nodes.

5. The system of claim 1 further including at least one analog to digital converter configured to convert the voltage from the at least two charge sensing nodes into a digital signal.

6. The system of claim 1 further wherein at least one of the charge sensing nodes is configured to sum the electrical charge of at least two of the cells.

7. A method for producing a voltage signal segmented to represent an output of an array of cells that produce a cell electrical charge in response to photon stimulation, the method comprising:
   (a) receiving each of the cell electrical charges from the cells in a charge shift register having a plurality of charge containers for storing charge;
   (b) sequentially shifting the charges between the charge containers and outputting the cell electrical charges from the charge containers of the charge shift register to a charge demultiplexor;
   (c) the charge demultiplexor selectively distributing the sequential cell charges to one of at least two charge sensing nodes; and,
   (d) sequentially reading a voltage produced by the cell charges in at least one of the at least two charge sensing nodes.

8. The method of claim 7 wherein the charge demultiplexor selectively distributing the sequential cell charges to one of at least two charge sensing nodes includes the charge demultiplexor distributing one cell charge to each of the at least two charge sensing nodes.

9. The method of claim 7 wherein the charge demultiplexor selectively distributing the sequential cell charges to one of at least two charge sensing nodes includes the charge demultiplexor distributing multiple cell charges to each of the at least two charge sensing nodes.

10. The method of claim 7 further including summing at least two of the distributed cell charges on at least one of the charge sensing nodes before sequentially reading the voltage produced by the cell charges.

11. A system for producing a voltage signal segmented to represent an output of an array of cells that produce an electrical charge in response to photon stimulation, the system comprising:
    (a) a charge shift register having a plurality of charge containers for storing charge, the charge shift register configured to sequentially receive the charge from each cell and shift the charges between the charge containers;
    (b) at least two charge sensing nodes configured to accumulate charge and output a voltage signal;
    (c) a charge demultiplexor configured to sequentially distribute each charge from the charge containers of the charge shift register to one of the at least two charge sensing nodes.

12. The system of claim 11 further including at least one output buffer configured to receive the voltage of each of the at least two charge sensing nodes.

13. The system of claim 11 further including at least one amplifier configured to receive and amplify the voltage of each of the at least two charge sensing nodes.

14. The system of claim 11 further including an analog to digital converter configured to convert the voltage from the at least two charge sensing nodes into a digital signal.

15. The system of claim 11 further wherein at least one of the charge sensing nodes is configured to sum the electrical charge of at least two of the cells.

* * * * *